US012641865B2

(12) United States Patent
Lee et al.

(10) Patent No.: US 12,641,865 B2
(45) Date of Patent: May 26, 2026

(54) FIELD-EFFECT TRANSISTOR STRUCTURE INCLUDING PASSIVE DEVICE OR BIPOLAR JUNCTION TRANSISTOR WITH BACK SIDE POWER DISTRIBUTION NETWORK (BSPDN)

(71) Applicant: SAMSUNG ELECTRONICS CO., LTD., Suwon-si (KR)

(72) Inventors: Jaehong Lee, Latham, NY (US); Seungchan Yun, Waterford, NY (US); Sooyoung Park, Clifton Park, NY (US); Kang-ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 517 days.

(21) Appl. No.: 18/094,597

(22) Filed: Jan. 9, 2023

(65) Prior Publication Data

US 2023/0163202 A1 May 25, 2023

Related U.S. Application Data

(60) Provisional application No. 63/401,879, filed on Aug. 29, 2022.

(51) Int. Cl.
    H10D 84/00 (2025.01)
    H10D 10/01 (2025.01)
    (Continued)

(52) U.S. Cl.
    CPC ......... H10D 84/121 (2025.01); H10D 10/041 (2025.01); H10D 30/6757 (2025.01); H10D 62/121 (2025.01); H10W 20/20 (2026.01)

(58) Field of Classification Search
    CPC .. H10D 84/817; H10D 84/038; H10D 84/409; H10D 84/121; H10D 84/401; H10D 10/60
    See application file for complete search history.

(56) References Cited

U.S. PATENT DOCUMENTS

| | | | | | |
|---|---|---|---|---|---|
| 4,215,322 A | * | 7/1980 | Iwanami | .............. | H10D 84/409 257/E27.032 |
| 5,467,057 A | * | 11/1995 | Joardar | ................ | H10D 84/409 257/E27.032 |

(Continued)

FOREIGN PATENT DOCUMENTS

EP         4109549 A1    12/2022

OTHER PUBLICATIONS

European Extended Search Report issued Jan. 26, 2024 issued by the European Patent Office for EP Patent Application No. 23184918.3.

Primary Examiner — Vincent Wall
(74) Attorney, Agent, or Firm — Myers Bigel, P.A.

(57) ABSTRACT

Provided is field-effect transistor structure including: a substrate including therein at least one $1^{st}$ doped region, a $2^{nd}$ doped region on one side of the $1^{st}$ doped region, and a $3^{rd}$ doped region on another side of the $1^{st}$ doped region; a $1^{st}$ channel structure including therein a $4^{th}$ doped region on the $2^{nd}$ doped region in the substrate; and a $2^{nd}$ channel structure, at a side of the $1^{st}$ channel structure, including therein a $5^{th}$ doped region on the $3^{rd}$ doped region in the substrate, wherein the $4^{th}$, $2^{nd}$, $1^{st}$, $3^{rd}$ and $5^{th}$ doped regions form a sequentially connected passive device.

25 Claims, 11 Drawing Sheets

(51) Int. Cl.
    *H10D 30/67*        (2025.01)
    *H10D 62/10*        (2025.01)
    *H10W 20/20*       (2026.01)

(56)            References Cited

U.S. PATENT DOCUMENTS

| | | | |
|---|---|---|---|
| 10,269,790 B2 | 4/2019 | Cheng et al. | |
| 11,075,197 B2 | 7/2021 | Shin et al. | |
| 11,217,578 B2 * | 1/2022 | Shin | H10D 30/6757 |
| 11,289,591 B1 | 3/2022 | Su et al. | |
| 11,715,735 B2 * | 8/2023 | Shin | H10D 1/47 |
| | | | 257/350 |
| 2009/0315112 A1 * | 12/2009 | Lee | H10D 84/038 |
| | | | 257/E21.409 |
| 2018/0175036 A1 * | 6/2018 | Ching | H10D 84/0179 |
| 2020/0152767 A1 * | 5/2020 | Armstrong | B82Y 10/00 |
| 2021/0028164 A1 * | 1/2021 | Shin | H10D 84/0158 |
| 2021/0184014 A1 * | 6/2021 | Guha | H10D 30/6729 |
| 2021/0193836 A1 * | 6/2021 | Guha | H10D 30/62 |
| 2021/0249516 A1 * | 8/2021 | Li | H10D 30/62 |
| 2021/0376155 A1 | 12/2021 | Chang et al. | |
| 2022/0059461 A1 | 2/2022 | Fu et al. | |
| 2022/0068942 A1 * | 3/2022 | Sakai | H10D 84/0186 |
| 2022/0102385 A1 | 3/2022 | Guha et al. | |
| 2022/0113199 A1 * | 4/2022 | Su | H01L 21/02603 |
| 2022/0384570 A1 * | 12/2022 | Liu | B82Y 10/00 |
| 2022/0392808 A1 * | 12/2022 | Guler | H10D 84/0158 |
| 2022/0399451 A1 * | 12/2022 | Guler | H10D 84/83 |
| 2022/0415880 A1 * | 12/2022 | Kar | H10D 84/811 |
| 2023/0163202 A1 * | 5/2023 | Lee | H10D 62/364 |
| | | | 257/288 |
| 2023/0197819 A1 * | 6/2023 | Bouche | H10D 84/0151 |
| | | | 257/401 |
| 2023/0197854 A1 * | 6/2023 | Guler | H10D 62/151 |
| | | | 257/401 |
| 2024/0266407 A1 * | 8/2024 | Liaw | H10D 30/797 |
| 2024/0349497 A1 * | 10/2024 | Youn | H10B 20/387 |
| 2025/0151325 A1 * | 5/2025 | Liaw | H10D 84/859 |

* cited by examiner

FIG. 2

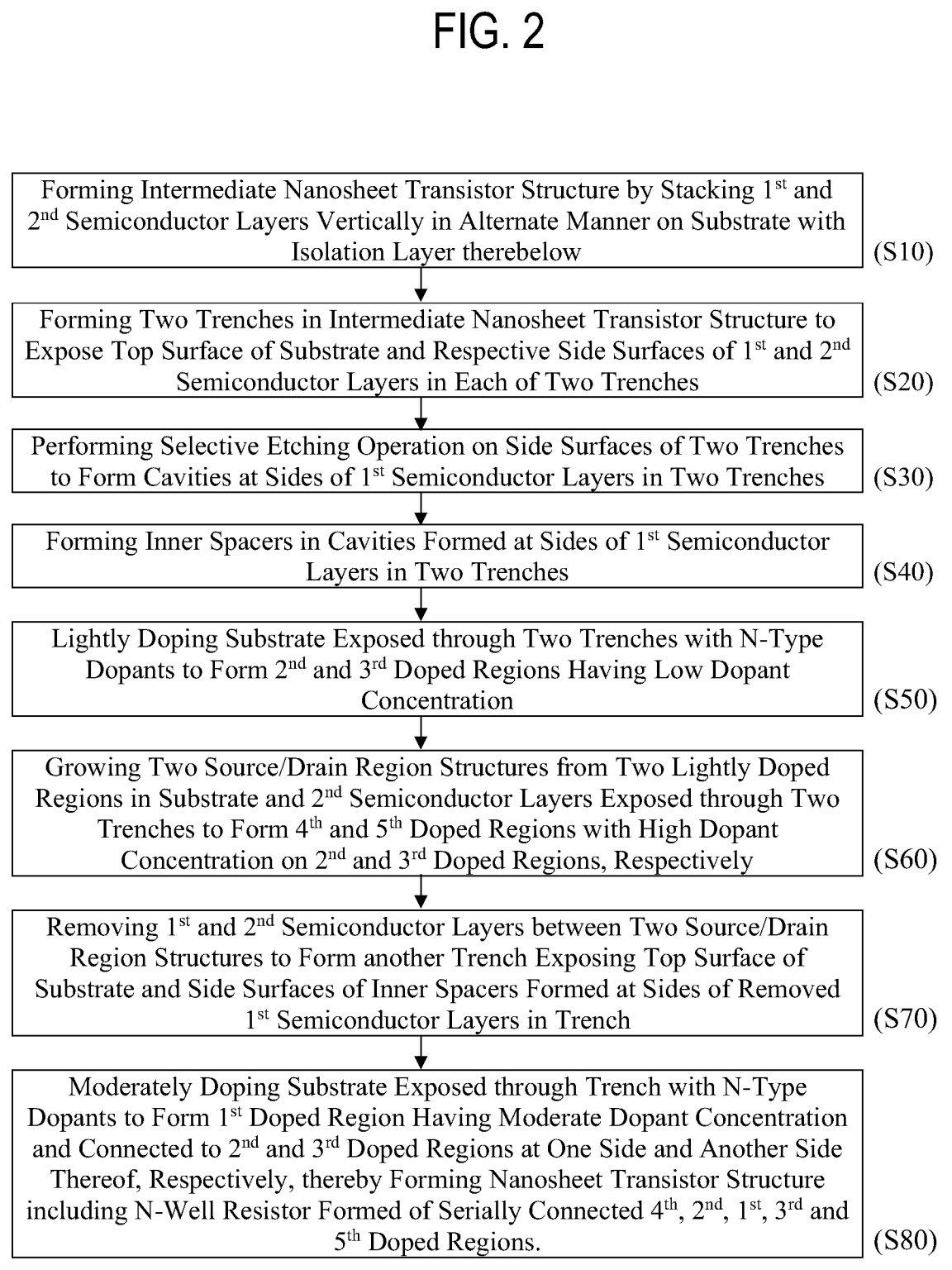

| Forming Intermediate Nanosheet Transistor Structure by Stacking $1^{st}$ and $2^{nd}$ Semiconductor Layers Vertically in Alternate Manner on Substrate with Isolation Layer therebelow | (S10) |

| Forming Two Trenches in Intermediate Nanosheet Transistor Structure to Expose Top Surface of Substrate and Respective Side Surfaces of $1^{st}$ and $2^{nd}$ Semiconductor Layers in Each of Two Trenches | (S20) |

| Performing Selective Etching Operation on Side Surfaces of Two Trenches to Form Cavities at Sides of $1^{st}$ Semiconductor Layers in Two Trenches | (S30) |

| Forming Inner Spacers in Cavities Formed at Sides of $1^{st}$ Semiconductor Layers in Two Trenches | (S40) |

| Lightly Doping Substrate Exposed through Two Trenches with N-Type Dopants to Form $2^{nd}$ and $3^{rd}$ Doped Regions Having Low Dopant Concentration | (S50) |

| Growing Two Source/Drain Region Structures from Two Lightly Doped Regions in Substrate and $2^{nd}$ Semiconductor Layers Exposed through Two Trenches to Form $4^{th}$ and $5^{th}$ Doped Regions with High Dopant Concentration on $2^{nd}$ and $3^{rd}$ Doped Regions, Respectively | (S60) |

| Removing $1^{st}$ and $2^{nd}$ Semiconductor Layers between Two Source/Drain Region Structures to Form another Trench Exposing Top Surface of Substrate and Side Surfaces of Inner Spacers Formed at Sides of Removed $1^{st}$ Semiconductor Layers in Trench | (S70) |

| Moderately Doping Substrate Exposed through Trench with N-Type Dopants to Form $1^{st}$ Doped Region Having Moderate Dopant Concentration and Connected to $2^{nd}$ and $3^{rd}$ Doped Regions at One Side and Another Side Thereof, Respectively, thereby Forming Nanosheet Transistor Structure including N-Well Resistor Formed of Serially Connected $4^{th}$, $2^{nd}$, $1^{st}$, $3^{rd}$ and $5^{th}$ Doped Regions. | (S80) |

10'

10'

FIELD-EFFECT TRANSISTOR STRUCTURE INCLUDING PASSIVE DEVICE OR BIPOLAR JUNCTION TRANSISTOR WITH BACK SIDE POWER DISTRIBUTION NETWORK (BSPDN)

CROSS-REFERENCE TO RELATED APPLICATION

This application is based on and claims priority from U.S. Provisional Application No. 63/401,879 filed on Aug. 29, 2022 in the U.S. Patent and Trademark Office, the disclosure of which is incorporated herein in its entirety by reference.

BACKGROUND

1. Field

Apparatuses and methods consistent with example embodiments of the disclosure relate to a field-effect transistor (FET) structure in which a passive device or a bipolar junction transistor (BJT) is formed.

2. Description of the Related Art

Growing demand for an integrated circuit having a high device density and performance has introduced a field-effect transistor (FET) such as fin field-effect transistor (FinFET) and a nanosheet transistor. The nanosheet transistor is also referred to as a multi-bridge channel field-effect transistor (MBCFET) or a gate-all-around (GAA) transistor. Further, a FET structure provided for forming a FinFET or nanosheet transistor is used to implement therein a device different from the transistor, for example, a passive device such as a resistor or diode in a substrate of the FET structure.

A backside power distribution network (BSPDN) formed at a back side of the FET structure, for example, below a top surface or a level of the top surface of a substrate of the FET structure, has been introduced to address a routing complexity at a back-end-of-line (BEOL) of the FET structure.

In order to form a BSPDN in the FET structure, a backside thinning process is applied to the substrate of the FET structure to obtain a space where the BSPDN can be formed at a backside of the semiconductor device. However, when the substrate for the FET structure is thinned for the formation of the BSPDN, it becomes difficult to form in the substrate one or more passive devices different from a transistor that is to be formed from the FET structure.

Thus, there is demand of an improved semiconductor device structure addressing the above problems and a method of manufacturing the same.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a field-effect transistor structure in which a passive device or a bipolar junction transistor (BJT) as well as a BSPDN structure is formed, and a method of manufacturing the same.

According to embodiments, there is provided a field-effect transistor structure which may include: a substrate including therein at least one $1^{st}$ doped region, a $2^{nd}$ doped region on one side of the $1^{st}$ doped region, and a $3^{rd}$ doped region on another side of the $1^{st}$ doped region; a $1^{st}$ channel structure including therein a $4^{th}$ doped region on the $2^{nd}$ doped region in the substrate; and a $2^{nd}$ channel structure, at a side of the $1^{st}$ channel structure, including therein a $5^{th}$ doped region on the $3^{rd}$ doped region in the substrate, wherein the $4^{th}$ $2^{nd}$, $1^{st}$ $3^{rd}$ and $5^{th}$ doped regions form a sequentially connected passive device or bipolar junction transistor (BJT).

According to embodiments, the field-effect transistor structure may further include an isolation layer on a bottom surface of the substrate. At least one BSPDN structure such as a backside contact plug may be formed on a bottom surface of at least one of the $1^{st}$ to $3^{rd}$ doped regions.

According to embodiments, there is provided a field-effect transistor structure which may include: a substrate including therein at least one $1^{st}$ doped region, a $2^{nd}$ doped region on one side of the $1^{st}$ doped region and a $3^{rd}$ doped region on another side of the $1^{st}$ doped region, wherein the $2^{nd}$, $1^{st}$, $3^{rd}$ doped regions form a sequentially connected passive device or bipolar junction transistor (BJT).

According to embodiments, the $1^{st}$ doped region may be divided into a left doped region and a right doped region side by side, wherein the left doped region and the right doped region include dopants of opposite polarity types, the $2^{nd}$ doped region and the left doped region comprise dopants of opposite polarity types, and the right doped region and the $3^{rd}$ doped region comprise dopants of opposite polarity types.

According to embodiments, there is provided a method of manufacturing a field-effect transistor structure including a passive device. The method may include: providing an intermediate field-effect transistor structure including a substrate and a channel structure thereon; doping at least one $1^{st}$ region of the substrate to form a $1^{st}$ doped region; doping a $2^{nd}$ region at a side of the $1^{st}$ region in the substrate to form a $2^{nd}$ doped region; and doping a $3^{rd}$ region at another side of the $1^{st}$ region in the substrate to form a $3^{rd}$ doped region, wherein the $2^{nd}$, $1^{st}$, $3^{rd}$ doped regions form a sequentially connected passive device or bipolar junction transistor (BJT).

BRIEF DESCRIPTION OF DRAWINGS

Example embodiments of the disclosure will be more clearly understood from the following detailed description taken in conjunction with the accompanying drawings in which:

FIG. 2 illustrates a flowchart of a method of manufacturing a nanosheet transistor structure that includes an N-well resistor, according to an embodiment;

Figure 4:
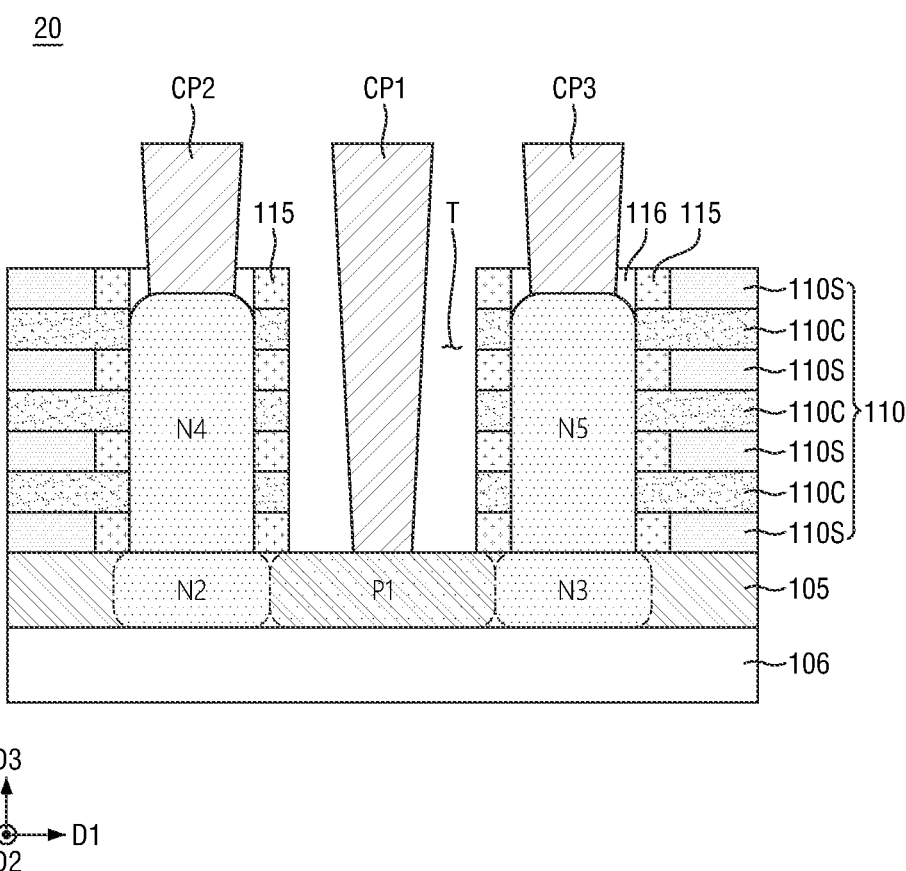
FIG. 4 illustrates a cross-section view of a nanosheet transistor structure in which an NPN diode is formed, according to an embodiment.
Figure 5:
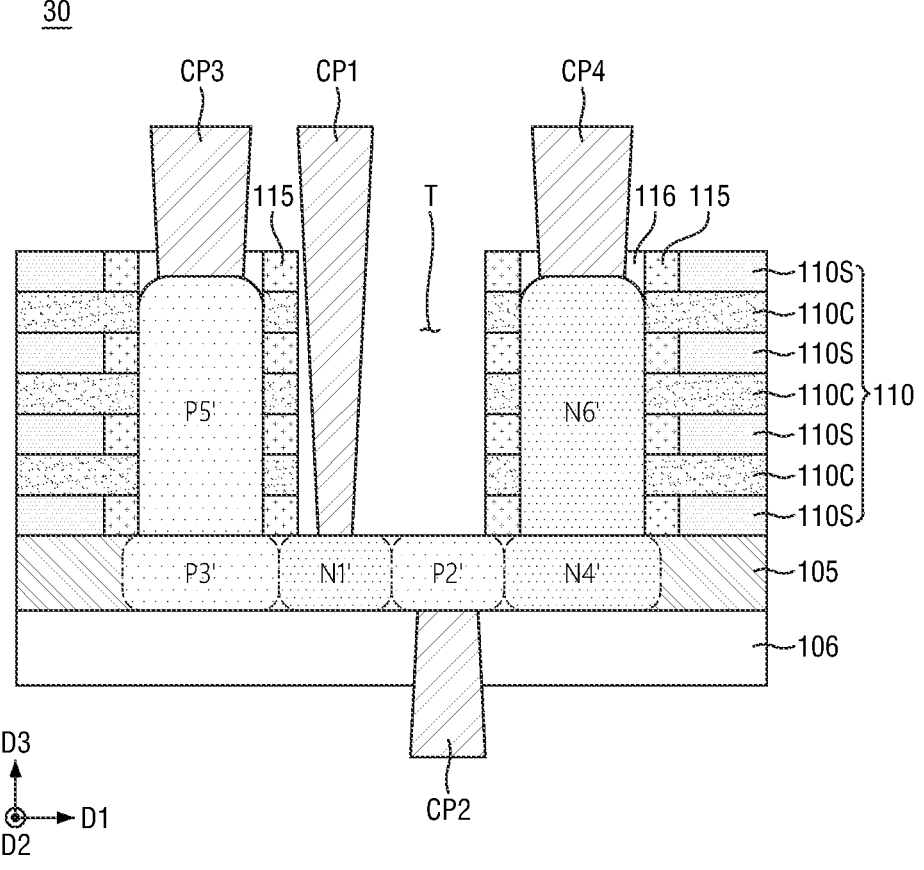
FIG. 5 illustrates a cross-section view of a nanosheet transistor structure in which a PNPN diode is formed, according to an embodiment.

3 substrate with a BSPDN structure thereon, in which a passive device or a bipolar junction transistor (BJT) is formed as shown in FIG. 1, 4 or 5, according to an example embodiment.

DETAILED DESCRIPTION OF EMBODIMENTS

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, nanosheet sacrificial layers, sacrificial isolation layers and channel isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$" etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor structure may or may not be described in detail herein. For example, a certain isolation layer or structure of a semiconductor device may be omitted herein when this layer or structure is not related to the various of aspects of the embodiments.

Figure 1A:
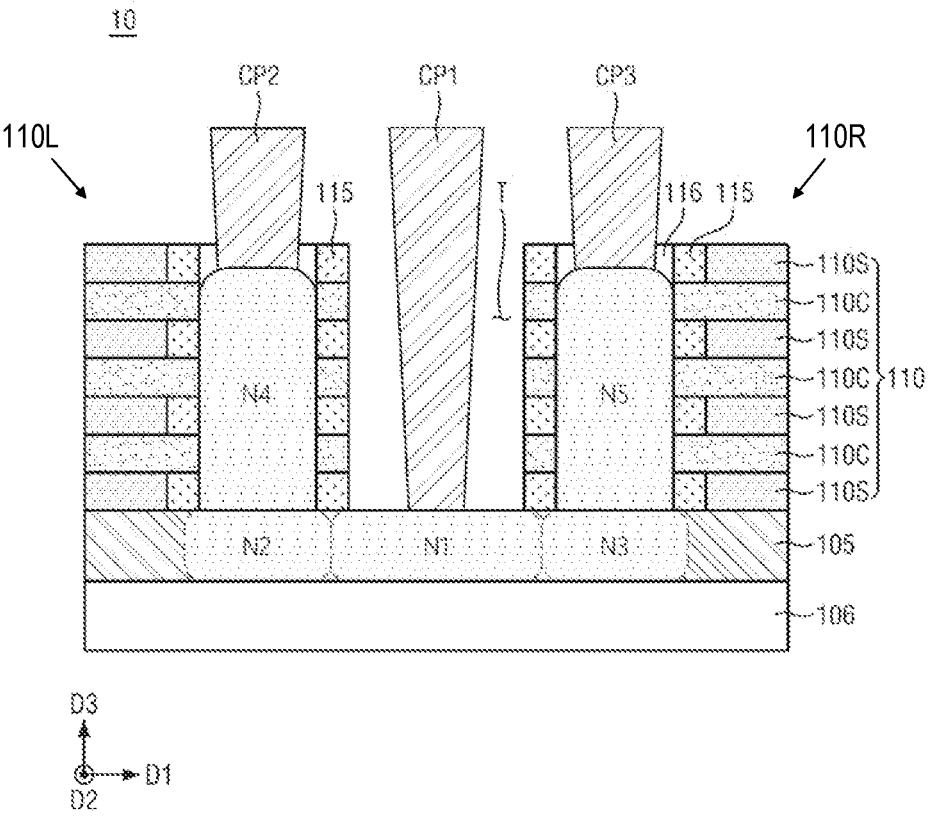
FIGS. 1A and 1B illustrate cross-section views of nanosheet transistor structures in each of which an N-well resistor is formed, according to embodiments.
Figure 1B:
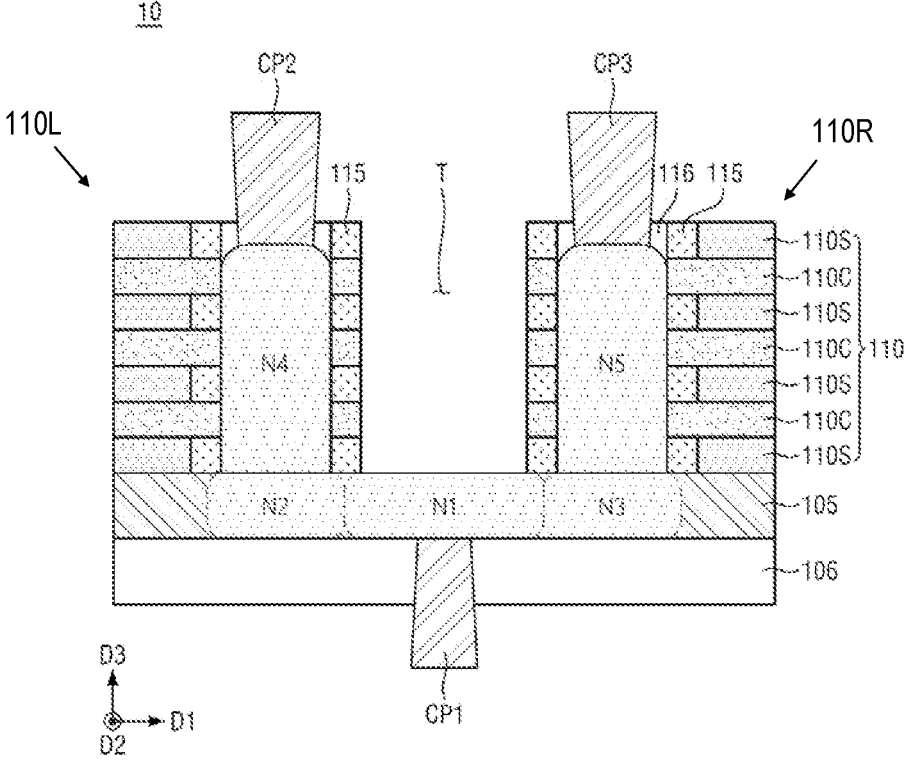

FIGS. 1A and 1B illustrate cross-section views of nanosheet transistor structures in each of which an N-well resistor is formed, according to embodiments.

It is understood here that FIGS. 1A and 1B and the other drawings referenced herein show views of corresponding nanosheet transistor structures in a D1 direction (a channel-length direction) horizontally perpendicular to a D2 direction (a channel-width direction).

Referring to FIG. 1A, a nanosheet transistor structure 10 may include a nanosheet channel structure 110 including a plurality of $1^{st}$ semiconductor layers 110S and $2^{nd}$ semiconductor layers 110C alternately stacked on a substrate 105 in a D3 direction which is a vertical direction. According to an embodiment, the substrate 105 may be formed of or include silicon, germanium or silicon-germanium, not being limited thereto. According to an embodiment, the substrate 105 may have a silicon on insulator (SOI) structure.

The nanosheet transistor structure including the nanosheet channel structure 110 may be originally provided to form one or more nanosheet transistors.

According to an embodiment, the $1^{st}$ semiconductor layers 110S of the nanosheet channel structure 110 may be formed of silicon-germanium, and the $2^{nd}$ semiconductor layers 110C of the nanosheet channel structure 110 may be formed of silicon. When one or more nanosheet transistors are formed in the nanosheet transistor structure 10, the $1^{st}$ semiconductor layers 110S may be replaced by a gate structure while the $2^{nd}$ semiconductor layers 110C may remain as channel layers to connect source/drain regions of a nanosheet transistor.

The nanosheet transistor structure 10 may include a $1^{st}$ portion 110L and a $2^{nd}$ portion 110R. According to an embodiments, a trench T may be formed in the nanosheet transistor structure 10 to divide the nanosheet channel structure 110 into the $1^{st}$ and $2^{nd}$ portions 110L and 120L. Herebelow, the $1^{st}$ and $2^{nd}$ portions of the nanosheet transistor structure 10 are referred to as $1^{st}$ and $2^{nd}$ nanosheet channel structures 110L and 110R, respectively. The $1^{st}$ and $2^{nd}$ nanosheet channel structures 110L and the 110R may be left and right nanosheet channel structures, respectively. When the nanosheet channel structure 110 is divided into the $1^{st}$ and $2^{nd}$ nanosheet channel structures 110L and 110R, the $1^{st}$ and $2^{nd}$ semiconductor layers 110S and 110C may also divided, so that each of the two nanosheet channel structures 110L and 110R may include the divided $1^{st}$ and $2^{nd}$ semiconductor layers 110S and 110C, as shown in FIG. 1A. According to an embodiment, the trench may be filled in with air (to form an air gap) or an isolation structure such as an interlayer dielectric (ILD) layer formed of silicon oxide, not being limited thereto.

Beneath the substrate 105 may be formed an isolation layer 106 which may be formed of a dielectric material such as silicon oxide, not being limited thereto. The isolation layer 106 may be provided to electrically isolate a BSPDN structure such as a backside contact plug formed therein, as will be described later in reference to FIG. 5.

In the substrate 105 may be formed a plurality of doped regions including $1^{st}$, $2^{nd}$ and $3^{rd}$ doped regions N1, N2 and N3. The $2^{nd}$ and $3^{rd}$ doped regions N2 and N3 may be formed at two sides of the $1^{st}$ doped region N1. For example, the $2^{nd}$ and $3^{rd}$ doped regions N2 and N3 may be formed at left and right sides of the $1^{st}$ doped region N1, respectively. The $2^{nd}$, $1^{st}$ and $3^{rd}$ doped regions N2, N1 and N3 may be horizontally arranged and serially connected to each other in the substrate 105 in the D1 direction. For example, the $2^{nd}$ doped region N2 may directly contact a left side portion or surface of the $1^{st}$ doped region N1, and the $3^{rd}$ doped region N3 may directly contact a right side portion or surface of the $1^{st}$ doped region N1.

In the $1^{st}$ and $2^{nd}$ nanosheet channel structures 110L and 110R may be formed $4^{th}$ and $5^{th}$ doped regions N4 and N5, respectively. As will be described later, each of the $4^{th}$ and $5^{th}$ doped regions N4 an N5 may be an epitaxial source/drain region structure, having a high dopant concentration, which is grown from the substrate 105 and the $2^{nd}$ semiconductor layers 110C. Thus, the $4^{th}$ and $5^{th}$ doped regions N4 and N5 may be formed of the same material forming the substrate 105 and the $2^{nd}$ semiconductor layers 110C.

The $4^{th}$ and $5^{th}$ doped regions N4 and N5 may be formed on the $2^{nd}$ and $3^{rd}$ doped regions N2 and N3 in the substrate 105, respectively. For example, the $4^{th}$ doped region N4 may directly contact a top portion or surface of the $2^{nd}$ doped region N2, and the $5^{th}$ doped region N5 may directly contact a top portion or surface of the $3^{rd}$ doped region N3. Further, the $4^{th}$ doped region N4 may be connected to the $2^{nd}$ semiconductor layers 110C and inner spacers 115 at left and right sides thereof in the $1^{st}$ nanosheet channel structure 110L. Similarly, the $5^{th}$ doped region N5 may be connected to the $2^{nd}$ semiconductor layers 110C and the inner spacers 115 at left and right sides thereof in the $2^{nd}$ nanosheet channel structure 110R. The inner spacers 115 may be formed of, for example, silicon nitride, silicon oxide, silicon oxynitride, etc. to isolate the source/drain region structures (i.e., the $4^{th}$ and $5^{th}$ doped regions N4 and N5) from the $1^{st}$ semiconductor layers 110S.

In the above manner, the $4^{th}$, $2^{nd}$, $1^{st}$, $3^{rd}$ and $5^{th}$ doped regions N4, N2, N1, N3 and N5 may be serially connected to each other in the nanosheet transistor structure 10.

According to an embodiment, the $4^{th}$, $2^{nd}$, $1^{st}$, $3^{rd}$ and $5^{th}$ doped regions N4, N2, N1, N3 and N5 may include n-type dopants (or impurities) such as phosphorous (P), arsenic (As), indium (In), etc. so that the $4^{th}$, $2^{nd}$, $1^{st}$, $3^{rd}$ and $5^{th}$ doped regions N4, N2, N1, N3 and N5 may form an N-well resistor.

According to an embodiment, the $4^{th}$, $2^{nd}$, $1^{st}$, $3^{rd}$ and $5^{th}$ doped regions N4, N2, N1, N3 and N5 may have different dopant concentrations (or doping levels). For example, the dopant concentration in the $1^{st}$ doped region N1 may be higher than that in the $2^{nd}$ and $3^{rd}$ doped regions N2 and N3, and lower than that in the $4^{th}$ and $5^{th}$ doped regions N4 and N5.

According to an embodiment, each of the $4^{th}$ and $5^{th}$ doped regions N4 and N5 may be a source/drain region structure provided to form a nanosheet transistor in the nanosheet transistor structure 10. Thus, the $4^{th}$ and $5^{th}$ doped regions N4 and N5 may have a high dopant concentration through an in-situ doping operation to form source/drain regions for a nanosheet transistor.

In contrast, the $2^{nd}$ and $3^{rd}$ doped regions N2 and N3 in the substrate 105 forming an interfacial structure between the $1^{st}$ doped region N1 and each of the $4^{th}$ and $5^{th}$ doped region N4 and N5, may have a low dopant concentration at least to facilitate epitaxial growth of the $4^{th}$ and $5^{th}$ doped regions N4 and N5, having a high dopant concentration, from the $2^{nd}$ and $3^{rd}$ doped regions N2 and N3, respectively. Here, the $4^{th}$ and $5^{th}$ doped regions N4 and N5 may form two terminals of the N-well resistor.

The doping concentration described above does not limit the disclosure. According to embodiments, the dopant concentration of the $1^{st}$ doped region N1 may be adjusted depending on the use of the N-well resistor formed by the doped regions N1-N5. That is, a target resistance for the N-well resistor may control the dopant concentration of at least one of the doped regions N1-N5. Further, the resistance of the N-well resistor may also be controlled by dimensions of at least one of the doped regions N1-N5, for example, a length of the $1^{st}$ doped region in the D1 direction and a width of the $1^{st}$ doped region in the D2 direction in addition to the dopant concentration therein.

On the $1^{st}$, $4^{th}$ and $5^{th}$ doped regions N1, N4 and N5 may be formed $1^{st}$ to $3^{rd}$ contact plugs CP1-CP3, respectively, as middle-of-line (MOL) structures of the nanosheet transistor structure 10. According to an embodiment, these front side contact plugs CP1-CP3 may be formed on top surfaces of the doped regions N1, N4 and N5, respectively, for connection of the N-well resistor to a back-end-of-line (BEOL) structure or for internal routing. However, the disclosure is not limited thereto. According to an embodiment, the $1^{st}$ contact plug CP1 may be a backside contact plug, that is, a BSPDN structure, formed on a bottom surface of the $1^{st}$ doped region N1 as shown in FIG. 1B. The contact plugs CP1-CP3 may each be formed of metal such as copper (Cu), tungsten (W), aluminum (Al), ruthenium (Ru), molybdenum (Mo), cobalt (Co), titanium (Ti), tantalum (Ta), etc. and their compound.

According to an embodiment, and using similar concepts, the $4^{th}$, $2^{nd}$, $1^{st}$, $3^{rd}$ and $5^{th}$ doped regions N4, N2, N1, N3 and N5 may include p-type dopants (or impurities) such as boron (B), gallium (Ga), etc. so that the $4^{th}$, $2^{nd}$, $1^{st}$, $3^{rd}$ and $5^{th}$ doped regions N4, N2, N1, N3 and N5 may form a P-well device.

As described earlier, the nanosheet transistor structure 10 with the thin substrate 105 may be originally provided to form one or more nanosheet transistors including a BSPDN structure. Thus, although not shown in FIGS. 1A and 1B, at least one nanosheet transistor may be formed based on the nanosheet transistor structure 10 when the nanosheet transistor structure 10 is horizontally extended, and further, at least one BSPDN structure may be connected to the nanosheet transistor through the thin substrate 105 and the isolation layer 106, according to embodiments.

Herebelow, a method of manufacturing a nanosheet transistor structure corresponding to the nanosheet transistor structure 10 shown in FIG. 1A will be described.

FIG. 2 illustrates a flowchart of a method of manufacturing a nanosheet transistor structure that includes an N-well resistor, according to an embodiment. FIGS. 3A to 3I illustrate intermediate nanosheet transistor structures after respective steps of a method of manufacturing a nanosheet transistor structure including an N-well resistor, according to embodiments.

The intermediate nanosheet transistor structures shown in FIGS. 3A to 3I may be the same as or correspond to the nanosheet transistor structure 10 shown in FIG. 1A. Thus, descriptions of materials and functions of structures or elements included in the intermediate multi-stack semiconductor devices may be omitted herebelow when they are duplicate. The same reference numbers and reference characters used for describing the nanosheet transistor structure 10 in FIG. 1A may be used herebelow when the same structures or elements are referred to.

In operation S10 (FIG. 2), $1^{st}$ and $2^{nd}$ semiconductor layers are vertically stacked in an alternate manner on a substrate with an isolation layer therebelow to form an intermediate nanosheet transistor structure.

Figure 3A:
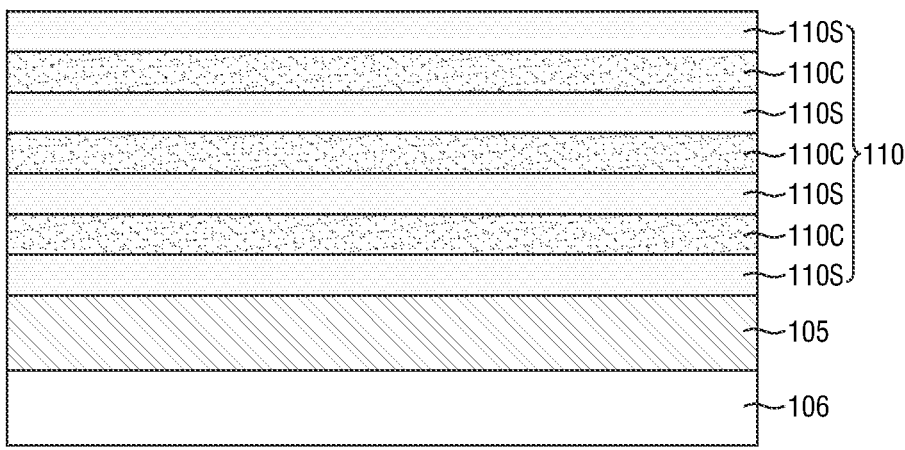
FIGS. 3A to 3I illustrate intermediate nanosheet transistor structures after respective steps of a method of manufacturing a nanosheet transistor structure including an N-well resistor, according to embodiments.

Referring to FIG. 3A, an intermediate nanosheet transistor structure 10' may be formed by epitaxially growing a nanosheet channel structure 110 including a plurality of $1^{st}$ and $2^{nd}$ semiconductor layers 110C and 110S from a substrate 105, according to an embodiment. The $1^{st}$ and $2^{nd}$ semiconductor layers 110C and 110S may be vertically and alternately grown from the substrate 105.

After or before the $1^{st}$ and $2^{nd}$ semiconductor layers 110C and 110S are grown on the substrate 105, the substrate 105 may be thinned on a back side thereof, and an isolation layer 106 may be formed beneath the thinned substrate 105. The isolation layer 106 may be provided to allow a BSPDN structure such as a backside contact plug or buried power rail (BPR) connecting a front-end-of-line (FEOL) structure of a nanosheet transistor formed based on the intermediate nanosheet transistor structure 10' to a voltage source. According to an embodiment, the formation of the isolation layer 106 may be performed after the BSPDN structure is formed on the thinned substrate 105.

In operation S20 (FIG. 2), two trenches are formed in the intermediate nanosheet transistor structure to expose a top surface of the substrate and respective side surfaces of the $1^{st}$ and $2^{nd}$ semiconductor layers in each of the two trenches.

Figure 3B:
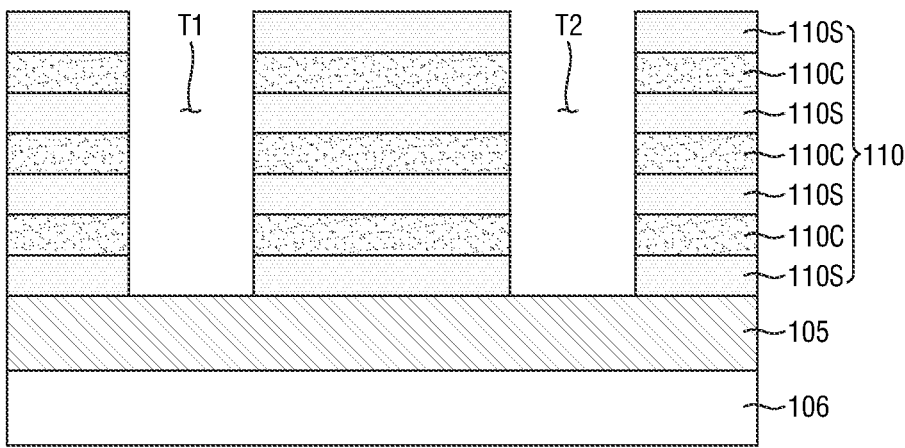

Referring to FIG. 3B, photolithography and etching operations may be performed on the intermediate nanosheet transistor structure 10' of FIG. 3A to form $1^{st}$ and $2^{nd}$ trenches T1 and T2 respectively exposing a top surface of the substrate 105 and respective side surfaces of the $1^{st}$ and $2^{nd}$ semiconductor layers 110S and 110C in each of the $1^{st}$ and $2^{nd}$ trenches.

Although not shown in FIG. 3B, photolithography patterns and hard mask structure may be formed at selected positions on a top surface of the intermediate nanosheet transistor structure 10' of FIG. 3A, and an etching operation, for example, drying etching such as reactive ion etching (RIE), may be performed based on the photolithography patterns and the hard mask structures to form the $1^{st}$ and $2^{nd}$ trenches T1 and T2.

According to an embodiment, the dimensions of the two trenches T1 and T2 including respective lengths L1 and L2 of the two trenches T1 and T2 and a distance L3 therebetween may be controlled according to a target resistance that an N-well resistor to be formed in the intermediate nanosheet transistor structure 10' will have. This is because, the dimensions of the two trenches T1 and T2 may define the dimensions of the N-well resistor to be formed in the intermediate nanosheet transistor structure 10' in a later step.

After the $1^{st}$ and $2^{nd}$ trenches T1 and T2 are formed, the photolithography patterns and the hard mask structures may be removed through, for example, an ashing operation.

In operation S30 (FIG. 2), a selective etching operation is performed on the side surfaces of two trenches to form cavities at sides of the $1^{st}$ semiconductor layers in the two trenches.

Figure 3C:
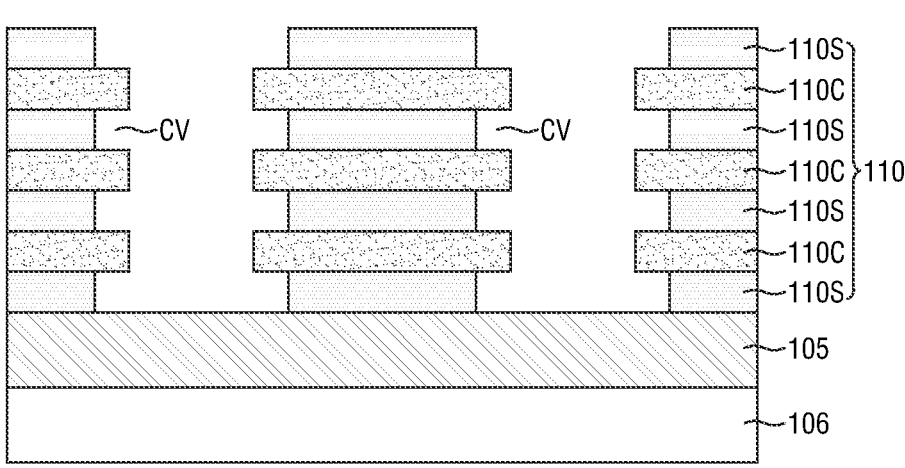

Referring to FIG. 3C, a selective etching operation may be performed on the side surfaces of the $1^{st}$ and $2^{nd}$ trenches T1 and T2 to selectively pull back or etch away side portions of the $1^{st}$ semiconductor layers 110S exposed through the $1^{st}$ and $2^{nd}$ trenches T1 and T2. For example, isotropic etching may be applied using, for example, a hydrogen chloride gas which etches a silicon germanium or a germanium component of the $2^{nd}$ semiconductor layers 110S without attacking the $2^{nd}$ semiconductor layers 110C formed of silicon. As another example, wet chemical etching and/or dry plasma etching may be used for this selective etching operation. Although not shown for brevity purposes, the selective etching operation in this step may be performed based on a dummy gate structure and a gate structure spacer (not shown) formed on a top surface of the intermediate nanosheet transistor structure 10' of FIG. 3B.

As the selective etching operation may attack only the $1^{st}$ semiconductor layers 110S, a portion of each of the $1^{st}$ semiconductor layers may be removed from the side surfaces thereof exposed through the $1^{st}$ and $2^{nd}$ trenches T1 and T2, and thus, respective cavities (or grooves) CV may be formed at sides of the $1^{st}$ semiconductor layers in the $1^{st}$ and $2^{nd}$ trenches T1 and T2.

In operation S40 (FIG. 2), inner spacers are formed in the cavities formed at the sides of the $1^{st}$ semiconductor layers in the two trenches.

Figure 3D:
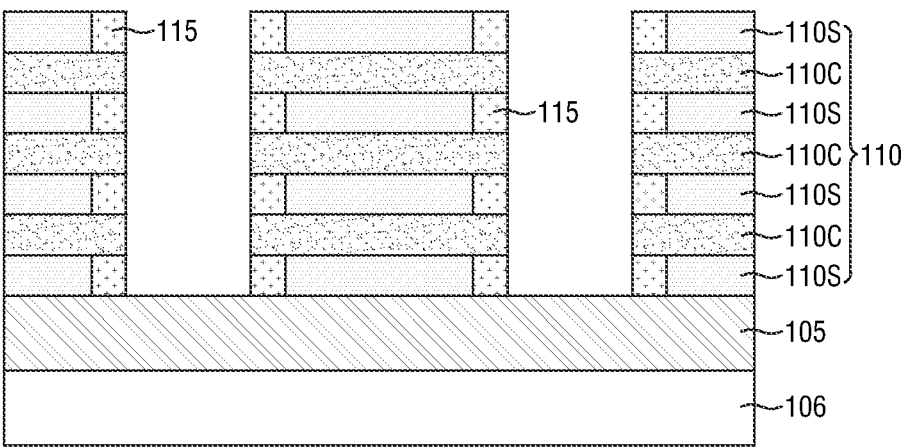

Referring to FIG. 3D, the cavities CV formed at the sides of the $1^{st}$ semiconductor layers in the previous step shown in FIG. 3C may be filled in with an inner spacer material to form inner spacers 115 therein. The inner spacer material may be conformally deposited on the cavities CV to form the inner spacers 115 by, for example, atomic layer deposition (ALD), plasma enhanced atomic layer deposition (PEALD), chemical vapor deposition (CVD), plasma enhanced chemical vapor deposition (PECVD), or combinations thereof, followed by isotropic wet chemical etching or dry etching, not being limited thereto so that side surfaces of the inner spacers 115 and the $2^{nd}$ semiconductor layers 110C exposed in the $1^{st}$ and $2^{nd}$ trenches T1 and T2 may be all vertically coplanar.

In operation S50 (FIG. 2), the substrate exposed through the two trenches are lightly doped with n-type dopants to form $2^{nd}$ and $3^{rd}$ doped regions having a low dopant concentration.

Figure 3E:
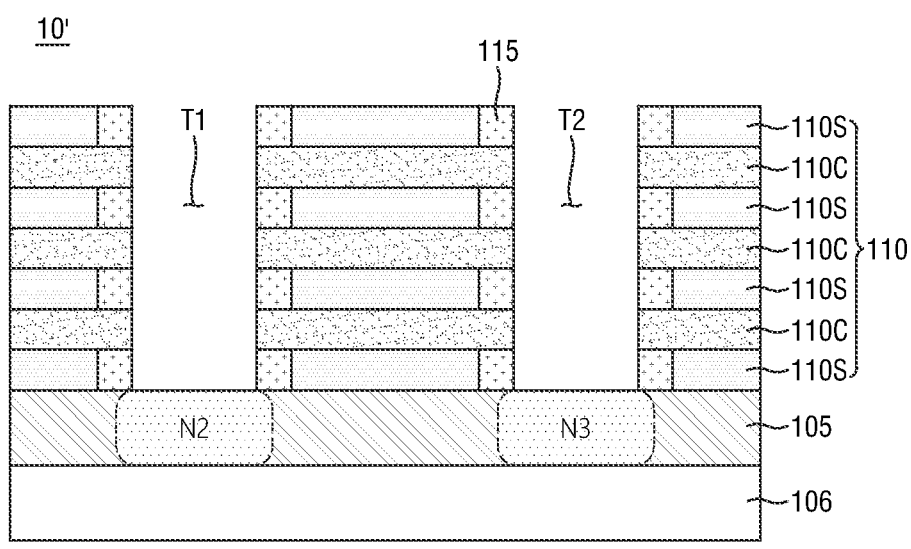

Referring to FIG. 3E, the substrate 105 exposed through the $1^{st}$ and $2^{nd}$ trenches T1 and T2 may be lightly doped with n-type dopants, thereby forming $2^{nd}$ and $3^{rd}$ doped regions N2 and N3 having a low dopant concentration in the substrate 105. The doping in this step may be performed through ion implantation, for example.

The $2^{nd}$ and $3^{rd}$ doped regions N2 and N3 may occupy an area below respective portions of a top surface of the substrate 105 exposed through the $1^{st}$ and $2^{nd}$ trenches T1 and T2.

According to an embodiment, the $2^{nd}$ and $3^{rd}$ doped regions N2 and N3 may be lightly doped to reduce interfacial resistance that may occur between the substrate 105 and highly-doped source/drain region structures to be formed on the $2^{nd}$ and $3^{rd}$ doped regions N2 and N3 in the next step.

In operation S60 (FIG. 2), two source/drain region structures highly doped with n-type dopants are grown from the two lightly doped regions in the substrate and the $2^{nd}$ semiconductor layers exposed through the two trenches to form $4^{th}$ and $5^{th}$ doped regions having a high dopant concentration on the $2^{nd}$ and $3^{rd}$ doped regions, respectively.

Figure 3F:
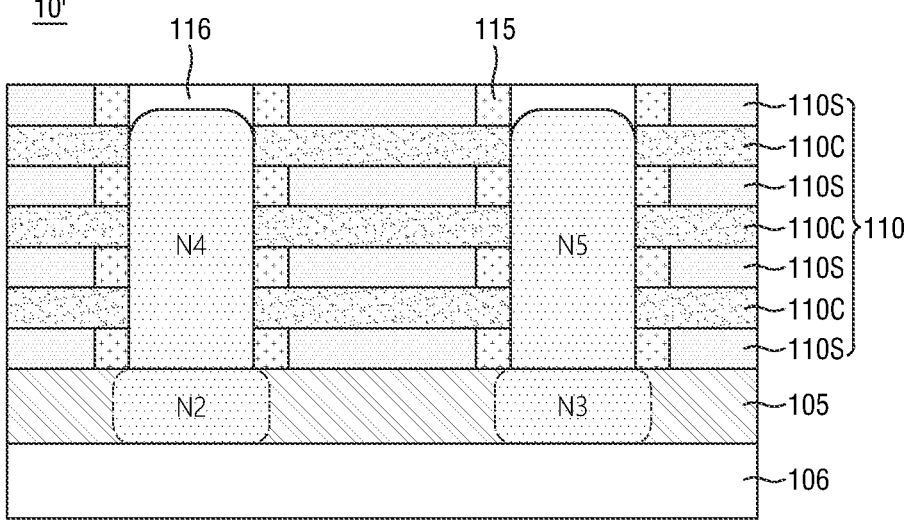

Referring to FIG. 3F, a source/drain region structure, which is in-situ doped with n-type dopants, may be formed on each of the $2^{nd}$ and $3^{rd}$ doped regions N2 and N3 formed in the substrate 105. The source/drain region structures may be epitaxially grown from the $2^{nd}$ semiconductor layers 110C and the substrate 105, and thus, the source/drain region structures may include the same material or material composition as the substrate 105 and the $2^{nd}$ semiconductor layers 110C, for example, silicon or silicon germanium.

According to an embodiment, the two source/drain region structures form $4^{th}$ and $5^{th}$ doped regions having a high dopant concentration as the source/drain region structures are in-situ doped with the n-type dopants.

According to an embodiment, the $4^{th}$ and $5^{th}$ doped regions may include the n-type dopants which are different from the n-type dopants included in the $2^{nd}$ and $3^{rd}$ doped regions.

After the $4^{th}$ and $5^{th}$ doped regions are formed, an ILD structure 116 may be formed on a top surface thereof to isolate the $4^{th}$ and $5^{th}$ doped regions from another circuit element in the intermediate nanosheet transistor structure 10'

In operation S70, portions of the $1^{st}$ and $2^{nd}$ semiconductor layers between the two source/drain region structures are removed to form another trench exposing the top surface of the substrate and side surfaces of the inner spacers formed at the sides of the removed $1^{st}$ semiconductor layers in the trench.

Figure 3G:
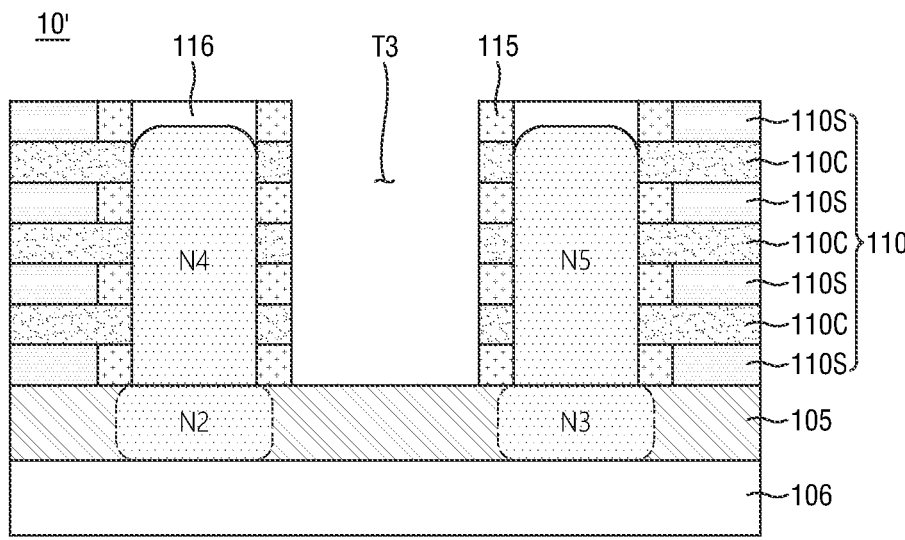

Referring to FIG. 3G, photolithography and etching operations may be performed again on the intermediate nanosheet transistor structure 10' of FIG. 3F to form a $3^{rd}$ trench T3 exposing the top surface of the substrate 105 and side surfaces of the inner spacers 115 formed at the removed $1^{st}$ semiconductor layers 110S in the $3^{rd}$ trench T3 (and side surfaces of portions of the $2^{nd}$ semiconductor layers 110C vertically between the inner spacers 115).

Although not shown in FIG. 3G, photolithography patterns and hard mask structures may be formed at selected positions on the top surface of the intermediate nanosheet transistor structure 10' of FIG. 3F, and an etching operation, for example, drying etching such as reactive ion etching (RIE) may be performed based on the photolithography patterns and the hard mask structures to form the $3^{rd}$ trench T3.

After the $3^{rd}$ trench T3 is formed, the photolithography patterns and the hard mask structures may be removed through, for example, an ashing operation.

In operation S80, the substrate exposed through the trench is moderately doped with n-type dopants to form a $1^{st}$ doped region having a moderate dopant concentration and connected to the $2^{nd}$ and $3^{rd}$ doped regions at one side and another side thereof, respectively, thereby forming a nanosheet transistor structure including an N-well resistor formed of the $4^{th}$, $2^{nd}$, $1^{st}$, $3^{rd}$ and $5^{th}$ doped regions which are serially connected to each other.

Figure 3H:
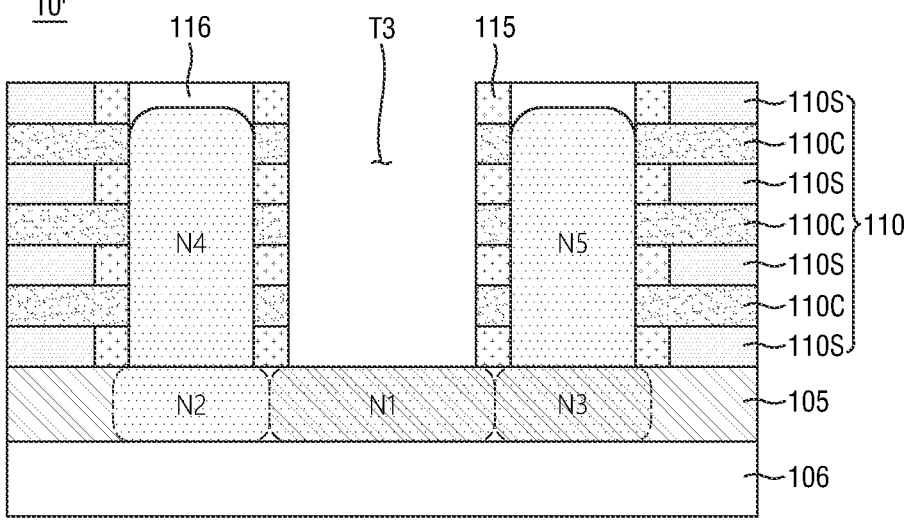

Referring to FIG. 3H, the substrate 105 exposed through the $3^{rd}$ trench T3 may be moderately doped with n-type dopants so that a $1^{st}$ doped region T1 having a moderate dopant concentration may be obtained in the substrate 105. The doping in this step may be performed through ion implantation, for example.

The $1^{st}$ doped region N1 may occupy an area below a portion of the top surface of the substrate 105 exposed through the 3rd trench T3, and may further be connected to the $2^{nd}$ doped region N2 at one side thereof and $3^{rd}$ doped region at another side thereof.

As described earlier in reference to FIG. 1A, a dopant concentration in the $1^{st}$ doped region T1 may be higher than that in the $2^{nd}$ and $3^{rd}$ doped region N2 and N3, and lower than that in the $4^{th}$ and $5^{th}$ doped region N4 and N5. However, the disclosure is not limited thereto. According to embodiments, the dopant concentration in the doped region N1 may be controlled to be higher (greater) than or equal to those in the doped regions N4 and N5, or lower (smaller) than or equal to those in the doped regions N2 and N3 subject to the use of the N-well resistor formed of the doped regions N1-N5.

Thus, an N-well resistor formed of the $4^{th}$, $2^{nd}$, $3^{rd}$ and $5^{th}$ doped regions N4, N2, N1, N3 and N5 which are serially connected may be formed in the intermediate nanosheet transistor structure 10'.

Figure 3I:
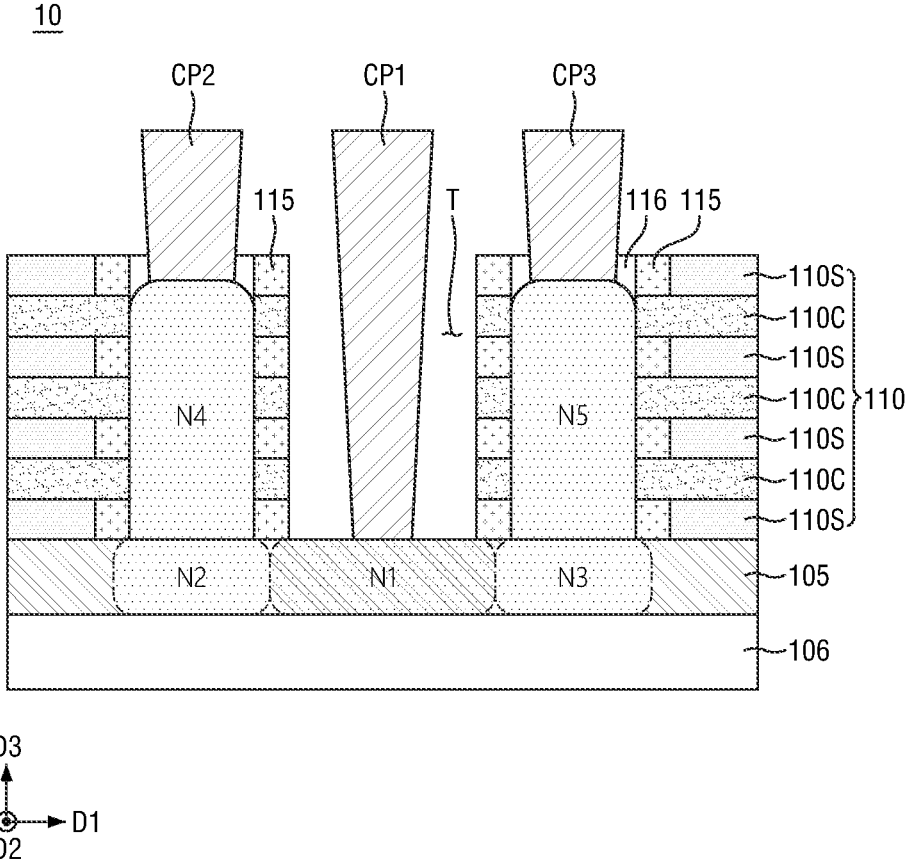

Further, referring to FIG. 3I, $1^{st}$ to $3^{rd}$ contact plugs CP1-CP3 may be formed on top surfaces of the doped regions N1, N4 and N5, respectively, for connection of the N-well resistor to a BEOL structure or for internal routing, thereby obtaining the N-well resistor formed in the nanosheet transistor structure 10 as shown in FIG. 1A.

Alternatively, a backside contact plug (BCA1 shown in FIG. 1B) may be formed instead of the $1^{st}$ contact plug CP1 to form the N-well resistor based on a BSPDN structure.

As described above, even if the nanosheet transistor structure 10 includes a thin substrate with an isolation layer therebelow for formation of a BSPDN structure, a passive device such as the N-well resistor may be easily formed in the nanosheet transistor structure 10 at least because the $1^{st}$ to $3^{rd}$ doped regions N1-N3 are arranged in the D1 direction.

The above embodiments of the nanosheet transistor structure in which the N-well resistor is formed do not limit the disclosure. According to embodiments, other devices such as an NPN or PNP bipolar junction transistor (BJT) and a PNPN diode may also be formed in a nanosheet transistor structure similar to the nanosheet transistor structure 10 of FIG. 1A.

FIG. 4 illustrates a cross-section view of a nanosheet transistor structure in which an NPN transistor is formed, according to an embodiment.

Referring to FIG. 4, a nanosheet transistor structure 20 may have the same structure as the nanosheet transistor structure 10 of FIG. 1A except that the $1^{st}$ doped region N1 is replaced with a $1^{st}$ doped region P1 including p-type dopants such as such as boron (B), gallium (Ga), etc. A method of manufacturing the nanosheet transistor structure 20 may be similar to the above-described method of manufacturing the nanosheet transistor structure 10, and thus, only different aspects are described herebelow.

According to an embodiment, the nanosheet transistor structure 20 may be formed by, in operation S80 of FIG. 2 in reference to FIG. 3H, doping the substrate 105 exposed through the $3^{rd}$ trench T3 with the p-type dopants to form the $1^{st}$ doped region P1. The doping in this step may be performed through ion implantation, for example. Thus, an NPN transistor including the $4^{th}$, $2^{nd}$, $1^{st}$, $3^{rd}$ and $5^{th}$ doped regions N4, N2, P1, N3 and N5 may be formed in the nanosheet transistor structure 20.

Alternatively, when the $2^{nd}$ to $5^{th}$ doped regions N2-N5 are replaced with doped regions having respective p-type dopant concentrations while the $1^{st}$ doped region N1 is maintained in the nanosheet transistor structure 10 of FIG. 1A, the nanosheet transistor structure 10 may have a PNP transistor formed therein.

FIG. 5 illustrates a cross-section view of a nanosheet transistor structure in which a PNPN diode is formed, according to an embodiment.

Referring to FIG. 5, a nanosheet transistor structure 30 may have the same structures as the nanosheet transistor structure 10 of FIG. 1A except that the $1^{st}$ doped region N1 is replaced with $1^{st}$ and $2^{nd}$ doped regions N1' and P2', and the $2^{nd}$ to $5^{th}$ doped regions N2-N4 are replaced with $3^{rd}$ and $6^{th}$ doped regions P3', N4', P5' and N6', respectively. A method of manufacturing the nanosheet transistor structure 30 may also be similar to the above-described method of manufacturing the nanosheet transistor structure 10, and thus, only different aspects are described herebelow.

According to an embodiment, the $1^{st}$, $4^{th}$ and $6^{th}$ doped regions N1', N4' and N6' may include n-type dopants such as phosphorous (As), arsenic (Sb), indium (In), etc., and the $2^{nd}$, $3^{rd}$ and $5^{th}$ doped regions P2', P3' and P5' may include p-type dopants such as boron (B), gallium (Ga), etc.

According to an embodiment, the dopant concentration (n-type) in the $1^{st}$ doped region N1' may be higher than that in the $4^{th}$ doped region N4' and lower than that in the $6^{th}$ doped region N6', and the dopant concentration (p-type) in the $2^{nd}$ doped region P2' may be higher than that in the $3^{rd}$ doped region P3' and lower than that in the $5^{th}$ doped region P5'. This is because the $3^{rd}$ doped region P3' and the $4^{th}$ doped region N4' are interfacial structures similar to the $2^{nd}$ and $3^{rd}$ doped regions N2 and N3 in the nanosheet transistor structure 10 of FIG. 1A, and the $5^{th}$ and $6^{th}$ doped regions P5' and N6' are source/drain region structures which are in-situ doped from the substrate 105 and the $2^{nd}$ semiconductor layer 110C.

According to an embodiment, the nanosheet transistor structure 30 may be formed by, in operation S50 of FIG. 2 in reference to FIG. 3E, doping the substrate 105 exposed through the $1^{st}$ trench T1 with p-type dopants to form the $3^{rd}$ doped region P3'. Further, in operation S60 of FIG. 2 in reference to FIG. 3F, a source/drain region structure in-situ doped with p-type dopants may be epitaxially grown in the $1^{st}$ trench T1 to form the $5^{th}$ doped region P5', and in operation S80 of FIG. 2 in reference to FIG. 3H, the substrate 105 exposed through the $3^{rd}$ trench T3 may be doped with n-type dopants and p-type dopants at two different regions to form the $1^{st}$ doped region N1' and the $2^{nd}$ doped region P2', respectively. According to an embodiment, the $1^{st}$ and $2^{nd}$ doped regions N1' and P2' may be formed side by side by two separate ion implantation steps. Thus, a PNPN diode including the $5^{th}$, $3^{rd}$ $1^{st}$, $2^{nd}$, $4^{th}$ and $6^{th}$ doped regions P5', P3', N1', P2', N4' and N6' may be formed in the nanosheet transistor structure 30.

According to an embodiment, the dopant concentration (n-type) in the $1^{st}$ doped region N1' may be higher than that in the $4^{th}$ doped region N4' and lower than that in the $6^{th}$ doped region N6', and the dopant concentration (p-type) in the $2^{nd}$ doped region P2' may be higher than that in the $3^{rd}$ doped region P3' and lower than that in the $5^{th}$ doped region P5'.

The PNPN diode formed in nanosheet transistor structure 30 may be connected to a voltage source or other circuit elements through $1^{st}$ to $4^{th}$ contact plugs CP1-CP4 respectively formed on the $1^{st}$, $2^{nd}$, $5^{th}$ and $6^{th}$ doped regions N1', P2', P5' and N6' as shown in FIG. 5. Here, the $2^{nd}$ contact plug P2 as a BSPDN structure may be formed on a bottom surface of the $2^{nd}$ doped region P2' though the isolation layer 106 formed beneath the substrate 105, while the $1^{st}$, $3^{rd}$ and $4^{th}$ contact plugs may each be a front side contact plug connected from a BEOL of the nanosheet transistor structure 30.

Thus, even if a nanosheet transistor structure includes a thin substrate with an isolation layer therebelow for formation of a BSPDN structure, a passive device such as an N-well resistor, an NPN or PNP bipolar junction transistor (BJT), and a PNPN diode may be easily formed in the nanosheet transistor structure.

In the above embodiments, the passive devices or BJTs included in each of the nanosheet transistor structures 10, 20 and 30 shown in FIGS. 1, 4 and 5 includes two source/drain region structures formed in the nanosheet channel structure 110. However, the disclosure may not limited thereto. According to embodiments, these passive devices or BJTs may be implemented without the two source/drain region structures formed in the nanosheet channel structure 110. For example, in the nanosheet channel structure 10 shown in FIG. 1A, the $4^{th}$ and $5^{th}$ doped regions N4 and N5 may not be formed on the $2^{nd}$ and $3^{rd}$ doped regions N2 and N3 in the substrate 105, and the $2^{nd}$ and $3^{rd}$ contact plugs may be connected to top surfaces of the $2^{nd}$ and $3^{rd}$ doped regions N2 and N3, respectively, to form an N-well register. Further, according to an embodiment, at least one of the $2^{nd}$ and $3^{rd}$ contact plugs may be a BSPDN contact plug connected to a bottom surface of at least one of the $2^{nd}$ and $3^{rd}$ doped regions N2 and N3.

In the above, various embodiments in which a passive device or BJT is formed in a nanosheet transistor structure have been described. However, the disclosure may also apply to other types of FET structure such as an FinFET structure, a nanowire structure, a nanobeam structure, etc., and thus, the passive device or BJT may also be formed in a different FET structure in the above or similar manner.

Figure 6:
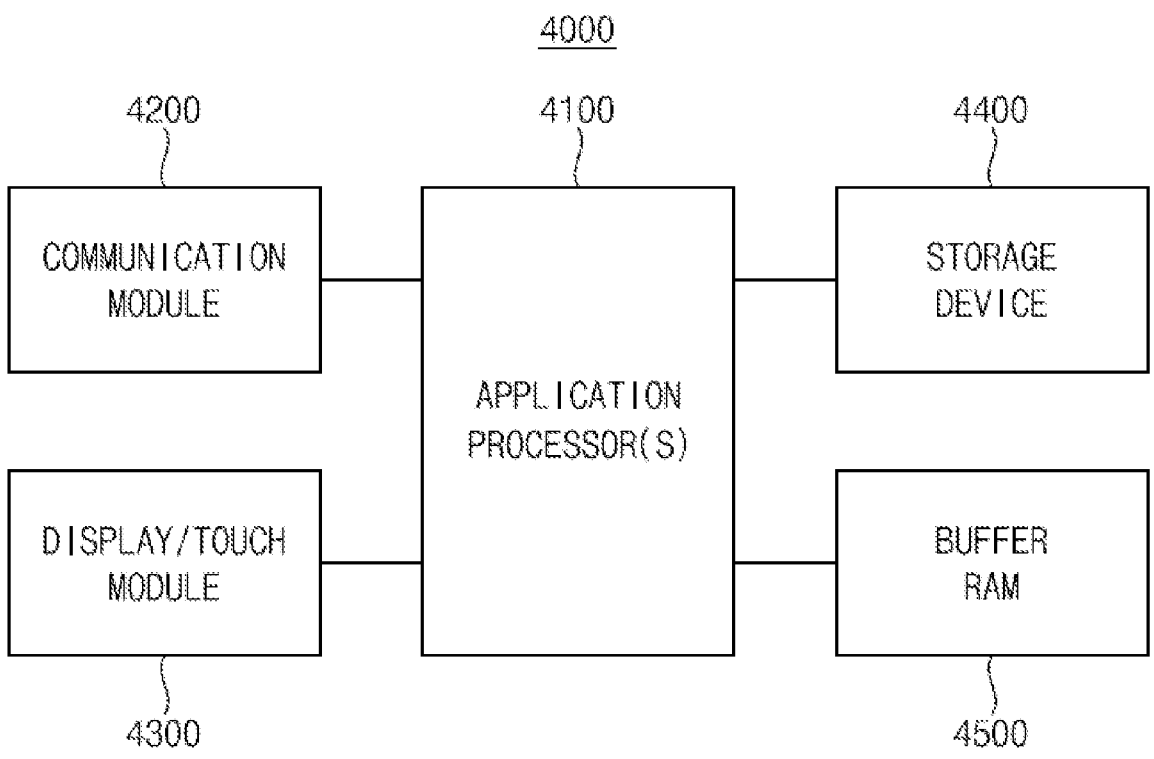
FIG. 6 is a schematic block diagram illustrating an electronic device including an FET structure with a thin

FIG. 6 is a schematic block diagram illustrating an electronic device including an FET structure with a thin substrate with a BSPDN structure in which a passive device or BJT is formed as shown in FIG. 1, 4 or 5, according to an example embodiment.

Referring to FIG. 6, an electronic device 4000 may include at least one application processor 4100, a communication module 4200, a display/touch module 4300, a storage device 4400, and a buffer random access memory

13

(RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 6, the electronic device 4000 may further include at least one sensor such as an image sensor.

At least one component in the electronic device 4000 may include at least one of the nanosheet transistor structure 10, 20 and 30 shown in FIGS. 1, 4 and 5, respectively.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A field-effect transistor structure comprising:
a substrate comprising therein at least one $1^{st}$ doped region, a $2^{nd}$ doped region on one side of the $1^{st}$ doped region, and a $3^{rd}$ doped region on another side of the $1^{st}$ doped region;
a $1^{st}$ portion of a channel structure comprising therein a $4^{th}$ doped region on the $2^{nd}$ doped region in the substrate; and
a $2^{nd}$ portion of the channel structure, at a side of the $1^{st}$ portion, comprising therein a $5^{th}$ doped region on the $3^{rd}$ doped region in the substrate,
wherein the $4^{th}$, $2^{nd}$, $1^{st}$, $3^{rd}$ and $5^{th}$ doped regions form a sequentially connected passive device or bipolar junction transistor (BJT), and
wherein at least one of the $4^{th}$ doped region or the $5^{th}$ doped region extends vertically from a top surface of the substrate through the channel structure.

2. The field-effect transistor structure of claim 1, further comprising an isolation layer below the substrate.

3. The field-effect transistor structure of claim 1, wherein the $2^{nd}$ and $4^{th}$ doped regions comprise dopants of a same polarity type, and
wherein the $3^{rd}$ and $5^{th}$ doped regions comprise dopants of a same polarity type.

4. The field-effect transistor structure of claim 3, wherein a dopant concentration in the $2^{nd}$ doped region is lower than that in the $4^{th}$ doped region, and
wherein a dopant concentration in the $3^{rd}$ doped region is lower than that in the $5^{th}$ doped region.

5. The field-effect transistor structure of claim 1, wherein the $2^{nd}$, $4^{th}$, $3^{rd}$ and $5^{th}$ doped regions comprise dopants of a same polarity type.

6. The field-effect transistor structure of claim 5, wherein a dopant concentration in the $2^{nd}$ doped region is lower than that in the $4^{th}$ doped region, and
wherein a dopant concentration in the $3^{rd}$ doped region is lower than that in the $5^{th}$ doped region.

7. The field-effect transistor structure of claim 3, wherein a dopant concentration in the $1^{st}$ doped region is higher than that in each of the $2^{nd}$ and $3^{rd}$ doped regions, and lower than that in each of the $4^{th}$ and $5^{th}$ doped regions.

8. The field-effect transistor structure of claim 1, wherein the $1^{st}$ doped region comprises p-type dopants, and
wherein each of the $4^{th}$, $2^{nd}$, $3^{rd}$ and $5^{th}$ doped regions comprises n-type dopants.

9. The field-effect transistor structure of claim 1, wherein each of the $1^{st}$ and $2^{nd}$ portions of the channel structure comprises a plurality of $1^{st}$ and $2^{nd}$ semiconductor layers alternately vertically stacked on the substrate, and
wherein the $1^{st}$ semiconductor layers comprises silicon germanium, and the $2^{nd}$ semiconductor layers comprises silicon.

10. The field-effect transistor structure of claim 1, further comprising a $1^{st}$ contact plug on each of the $4^{th}$ and $5^{th}$ doped regions.

11. The field-effect transistor structure of claim 10, further comprising a $2^{nd}$ contact plug on the $1^{st}$ doped region.

12. The field-effect transistor structure of claim 1, wherein the $1^{st}$ portion is separated from the $2^{nd}$ portion by a trench comprising an air gap on the substrate or by an isolation structure on the substrate.

13. The field-effect transistor structure of claim 1, wherein the $1^{st}$ doped region comprises a left doped region and a right doped region side by side,
wherein the left doped region and the right doped region comprise dopants of opposite polarity types,
wherein the $2^{nd}$ doped region and the left doped region comprise dopants of opposite polarity types, and
wherein the right doped region and the $3^{rd}$ doped region comprise dopants of opposite polarity types.

14. The field-effect transistor structure of claim 13, wherein the $4^{th}$ doped region and the $2^{nd}$ doped region comprise dopants of a same polarity type, and
wherein the $5^{th}$ doped region and the $3^{rd}$ doped region comprise dopants of a same polarity type.

15. The field-effect transistor structure of claim 14, wherein the left doped region, the $3^{rd}$ doped region and the $5^{th}$ doped region comprise n-type dopants, and
wherein the right doped region, the $2^{nd}$ doped region and the $4^{th}$ doped region comprise p-type dopants.

16. A field-effect transistor structure comprising:
a substrate comprising therein at least one $1^{st}$ doped region, a $2^{nd}$ doped region on one side of the $1^{st}$ doped region, and a $3^{rd}$ doped region on another side of the $1^{st}$ doped region;
a channel structure above a top surface of at least one of the $1^{st}$, $2^{nd}$, or $3^{rd}$ doped regions; and
a contact plug in contact with the $1^{st}$ doped region,
wherein the $2^{nd}$, $1^{st}$, and $3^{rd}$ doped regions form a sequentially connected passive device or bipolar junction transistor.

17. The field-effect transistor structure of claim 16, further comprising another contact plug formed on a bottom surface of at least one of the $2^{nd}$, $1^{st}$, or $3^{rd}$ doped regions.

18. The field-effect transistor structure of claim 16, wherein the $2^{nd}$, $1^{st}$, and $3^{rd}$ doped regions comprise dopants of a same polarity type, and wherein a dopant concentration of the $1^{st}$ doped region is different from a dopant concentration of at least one of the $2^{nd}$ doped region or the $3^{rd}$ doped region.

19. The field-effect transistor structure of claim 18, wherein the $2^{nd}$ doped region is directly on the one side of the $1^{st}$ doped region, and the $3^{rd}$ doped region is directly on the another side of the $1^{st}$ doped region.

20. The field-effect transistor structure of claim 16, wherein the $1^{st}$ doped region and at least one of the $2^{nd}$ and $3^{rd}$ doped regions comprise dopants of different polarity types.

21. The field-effect transistor structure of claim 1, wherein the $1^{st}$ doped region comprises a left doped region and a right doped region side by side, wherein the left doped region and the right doped region comprise dopants of opposite polarity types, wherein the $2^{nd}$ doped region and the left doped region comprise dopants of opposite polarity types, and wherein the right doped region and the $3^{rd}$ doped region comprise dopants of opposite polarity types.

22. The field-effect transistor structure of claim 16, wherein the channel structure comprises $1^{st}$ semiconductor layers and $2^{nd}$ semiconductor layers alternately stacked on the substrate, and wherein the $1^{st}$ semiconductor layers comprise a $1^{st}$ material, and the $2^{nd}$ semiconductor layers comprise a $2^{nd}$ material different from the $1^{st}$ material.

23. The field-effect transistor structure of claim 16, wherein the contact plug extends between a $1^{st}$ portion of the channel structure and a $2^{nd}$ portion of the channel structure, and wherein the contact plug is spaced apart from the $1^{st}$ and $2^{nd}$ portions of the channel structure.

24. The field-effect transistor structure of claim 16, further comprising:

a $4^{th}$ doped region on the $2^{nd}$ doped region, the $4^{th}$ doped region and the $2^{nd}$ doped region comprising dopants of a same polarity type; and a $5^{th}$ doped region on the $3^{rd}$ doped region, the $5^{th}$ doped region and the $3^{rd}$ doped region comprising dopants of a same polarity type, wherein a dopant concentration of the $4^{th}$ doped region is different from a dopant concentration of the $2^{nd}$ doped region, and wherein a dopant concentration of the $5^{th}$ doped region is different from a dopant concentration of the $3^{rd}$ doped region.

25. A method of manufacturing a field-effect transistor structure comprising a passive device, the method comprising:

providing an intermediate field-effect transistor structure comprising a substrate and a channel structure thereon;

doping at least one $1^{st}$ region of the substrate to form a $1^{st}$ doped region;

doping a $2^{nd}$ region at a side of the $1^{st}$ region in the substrate to form a $2^{nd}$ doped region;

doping a $3^{rd}$ region at another side of the $1^{st}$ region in the substrate to form a $3^{rd}$ doped region; and forming a contact plug in contact with the $1^{st}$ doped region, wherein the $2^{nd}$, $1^{st}$, and $3^{rd}$ doped regions form a sequentially connected passive device or a bipolar junction transistor (BJT), and wherein the channel structure is above a top surface of at least one of the $1^{st}$, $2^{nd}$ or $3^{rd}$ doped regions.

* * * * *